(12) United States Patent
Lin et al.

(10) Patent No.: US 7,622,770 B2
(45) Date of Patent: Nov. 24, 2009

(54) SEMICONDUCTOR DEVICE HAVING A TRENCH GATE AND METHOD OF FABRICATING THE SAME

(75) Inventors: Jeng-Ping Lin, Taoyuan County (TW); Pei-Ing Lee, Changhua County (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 32 days.

(21) Appl. No.: 12/021,969

(22) Filed: Jan. 29, 2008

(65) Prior Publication Data

US 2008/0135907 A1    Jun. 12, 2008

Related U.S. Application Data

(62) Division of application No. 11/491,704, filed on Jul. 24, 2006.

(30) Foreign Application Priority Data

Dec. 19, 2005  (TW) .............................. 94145039 A

(51) Int. Cl.
*H01L 27/108*   (2006.01)
*H01L 29/76*    (2006.01)

(52) U.S. Cl. ...................... 257/330; 257/333; 438/270

(58) Field of Classification Search ......... 257/301–303, 257/330, 332–333, E29.345, E29.255, E29.262; 438/270
See application file for complete search history.

(56) References Cited

U.S. PATENT DOCUMENTS

| 5,183,775 A | 2/1993 | Levy |
| 5,424,231 A | 6/1995 | Yang |
| 6,188,104 B1 * | 2/2001 | Choi et al. .................. 257/330 |
| 6,852,597 B2 * | 2/2005 | Park et al. ................... 438/268 |
| 6,929,998 B2 | 8/2005 | Chen et al. |
| 2005/0173744 A1 | 8/2005 | Kim et al. |

\* cited by examiner

*Primary Examiner*—Theresa T Doan
(74) *Attorney, Agent, or Firm*—Winston Hsu

(57) ABSTRACT

A method of fabricating a semiconductor device having a trench gate is provided. First, a semiconductor substrate having a trench etch mask thereon is provided. The semiconductor substrate is etched to form a first trench having a first depth using the trench etch mask as a shield. Impurities are doped into the semiconductor substrate through the first trench to form a doped region. The doped region and the semiconductor substrate underlying the first trench are etched to form a second trench having a second depth greater than the first depth, wherein the second trench has a sidewall and a bottom. A gate insulating layer is formed on the sidewall and the bottom of the second trench. A trench gate is formed in the second trench.

4 Claims, 9 Drawing Sheets

SEMICONDUCTOR DEVICE HAVING A TRENCH GATE AND METHOD OF FABRICATING THE SAME

This application is a divisional of U.S. application Ser. No. 11/491,704, filed Jul. 24, 2006, the entire disclosure of which is hereby incorporated by reference.

BACKGROUND OF THE INVENTION

1. Field of the Invention

The invention relates to semiconductor fabrication, and in particular relates to a metal oxide semiconductor transistor (MOS transistor) having a trench gate and a method of fabricating the same.

2. Description of the Related Art

Semiconductor devices such as MOS transistors continue to develop achieving high performance, high integration and high operating speed. With continued integration the size of MOS transistors on a semiconductor substrate must be reduced. For example, higher integration of MOS transistors can be achieved by reducing gate length and/or source/drain region size. However, this may result in the short channel effect and significantly affect the performance of a semiconductor device such as a MOS transistor. U.S. Pat. No. 6,150,693 to Wollesen discloses a MOS transistor having a V-shaped trench and a gate oxide layer formed on the sidewall of the V-shaped trench. The gate fills the V-shaped trench. US patent publication number 2005/0001252 A1 to Kim et al. discloses a semiconductor device, a MOS transistor having a trench gate to alleviate the problem of the short channel effect.

Channel length of a semiconductor device having a trench gate is generally determined by the etch depth of the trench for a gate and the ion implantation depth of the source/drain region. The trench for a gate is conventionally formed by one-step etching of the semiconductor substrate. This may result in a large trench depth difference between the center and the edge of a semiconductor wafer, thus, the channel lengths of the MOS transistors in the center and edge of the semiconductor wafer are not uniform. That is to say, in a conventional method, process uniformity is not easily controlled and there is a problem of channel length variation in the prior arts.

BRIEF SUMMARY OF THE INVENTION

Therefore, there is a need to provide an improve semiconductor device having a trench gate and a method of fabricating the same so as to easily control the process and provide a semiconductor device with an improved performance.

The invention provides a semiconductor device having a trench gate and a method of fabricating the same capable of easily controlling the channel length and reducing the channel length variation.

The invention further provides a semiconductor device having a trench gate capable of reducing the capacitance between the gate and drain (Cgd) and/or gate-induced drain leakage.

An exemplary embodiment of a method of fabricating a semiconductor device having a trench gate comprises the following steps. First, a semiconductor substrate having a trench etch mask thereon is provided. The semiconductor substrate is etched to form a first trench having a first depth using the trench etch mask as a shield. Semiconductor substrate are doped with impurities through the first trench to form a doped region. The doped region and the semiconductor substrate underlying the first trench are etched to form a second trench having a second depth greater than the first depth, wherein the second trench has a sidewall and a bottom. A gate insulating layer is formed on the sidewall and the bottom of the second trench. A trench gate is formed in the second trench.

Another exemplary embodiment of a semiconductor device having a trench gate comprises a semiconductor substrate and a trench disposed in the semiconductor substrate. The semiconductor device further comprises a gate insulating layer formed on a sidewall and a bottom of the trench, and the gate insulating layer on the sidewall of the trench is thicker than that at the bottom of the trench. The semiconductor device further comprises a source/drain formed in the semiconductor substrate adjacent to the sidewall of the trench, a recessed channel in the semiconductor substrate underlying the trench and a gate formed in the trench.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

FIGS. 1 to 12 are cross sections of an exemplary process flow of manufacturing a semiconductor device having a trench gate.

Figure 1:
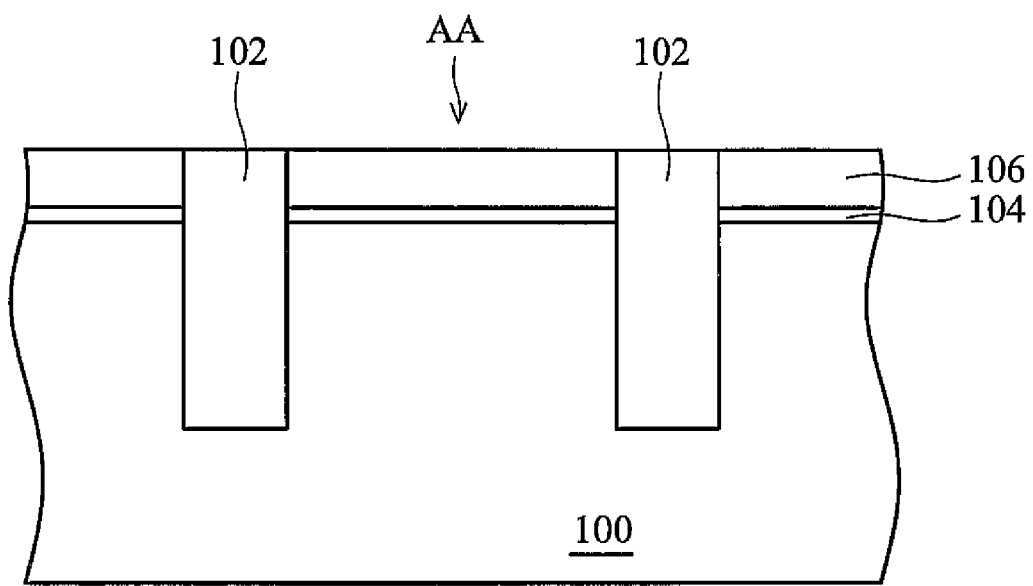
FIGS. 1 to 12 show cross sections of an exemplary process flow of manufacturing a semiconductor device having a trench gate.

As shown in FIG. 1, a semiconductor substrate 100 with a plurality of isolation elements such as shallow trench isolation (STI) 102 for defining an active area AA is provided. The semiconductor substrate 100 has a pad oxide layer 104 and a silicon nitride layer 106 thereon. The semiconductor substrate 100 may comprise silicon, gallium arsenide, gallium nitride, strained silicon, silicon germanium, silicon carbide, carbide, diamond, an epitaxy layer and/or other materials, and preferably is a silicon substrate.

Figure 2:
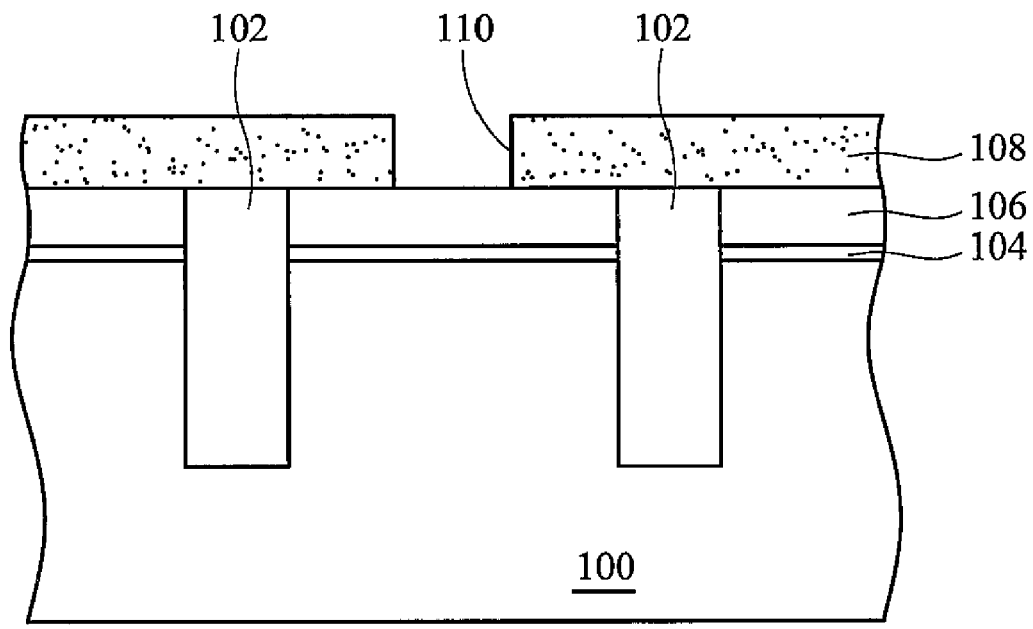
Figure 3:
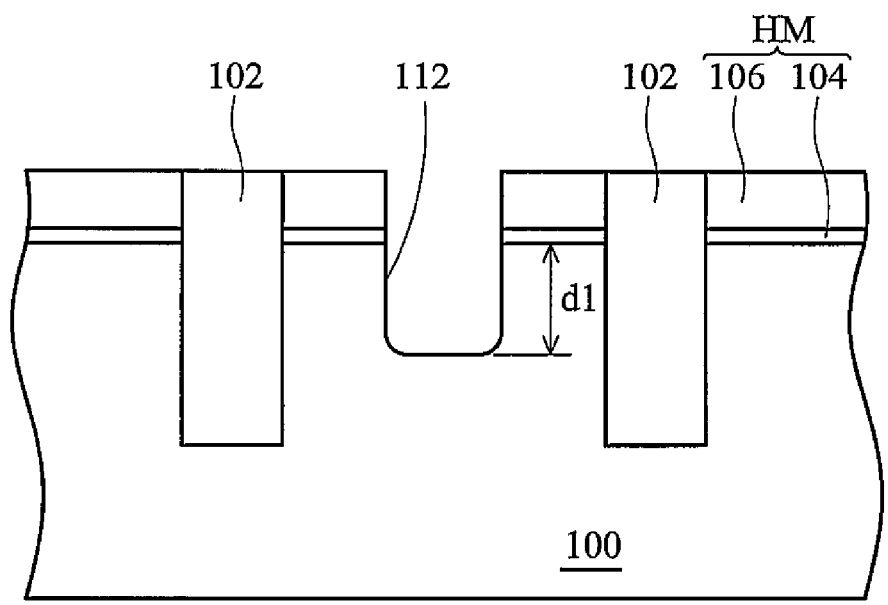

Referring to FIG. 2 and FIG. 3, a photoresist pattern 108 having an opening 110 is formed on the silicon nitride layer 106 by photolithography. The opening 110 is aligned with the position where the trench for a gate is to be formed in the active area AA. Using the photoresist pattern 108 as a etch mask, the pad oxide layer 104 and the silicon nitride layer 106 are etched through the opening 110 of the photoresist pattern 108 to form an trench etch mask HM followed by removing the photoresist pattern 108. The semiconductor substrate 100 is etched to form a first trench 112 having a first depth d1 while the trench etch mask HM is used as a shield. Preferably, the first depth d1 is between 1000 Å and 2000 Å, more preferably about 1500 Å. The semiconductor substrate 100 is etched by, for example, reactive ion etching (RIE) using an etching gas containing $Cl_2$, HBr, $O_2$, $CF_4$ or $SF_6$.

Figure 4A:
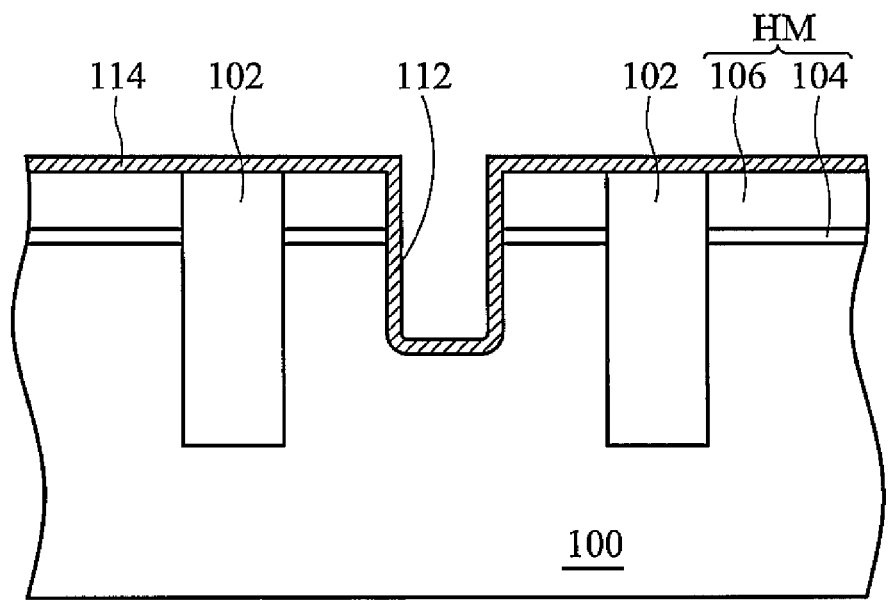

Then, as shown in FIG. 4a, a doped insulating layer 114 having a thickness of about 50 Å to 300 Å is conformally formed on the sidewall and the bottom of the first trench 112 in order to form a doped region as self-aligned source/drain region. The doped insulating layer 114 contains impurities (dopants) of n-type or p-type. For example, the doped insulating layer is phosphosilicate glass (PSG), arsenic silicate glass (ASG) or borosilicate glass (BSG). Moreover, the doped insulating layer 114 may be formed by plasma enhanced chemical vapor deposition (PECVD), low pressure chemical vapor deposition (LPCVD) or atomic layer chemical vapor deposition (ALCVD).

Figure 5:
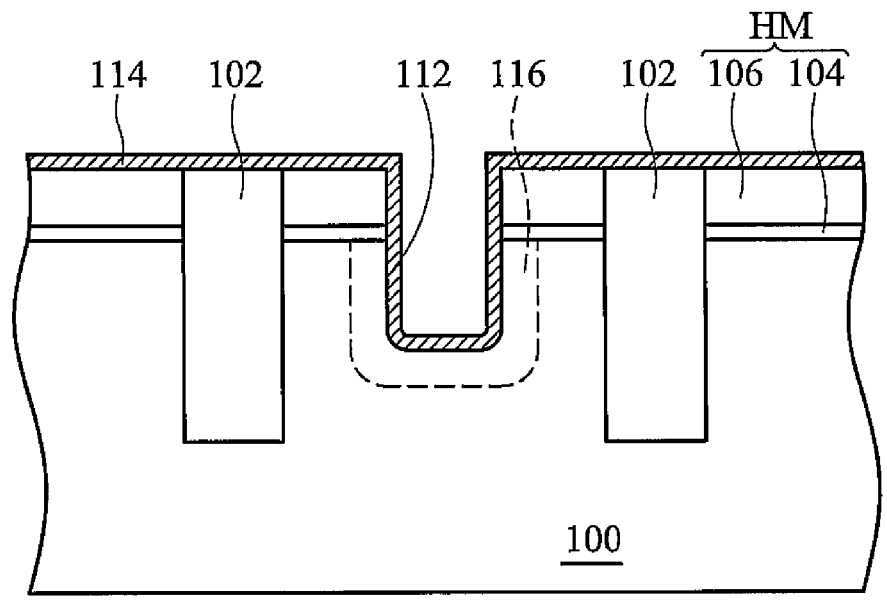
Figure 6:
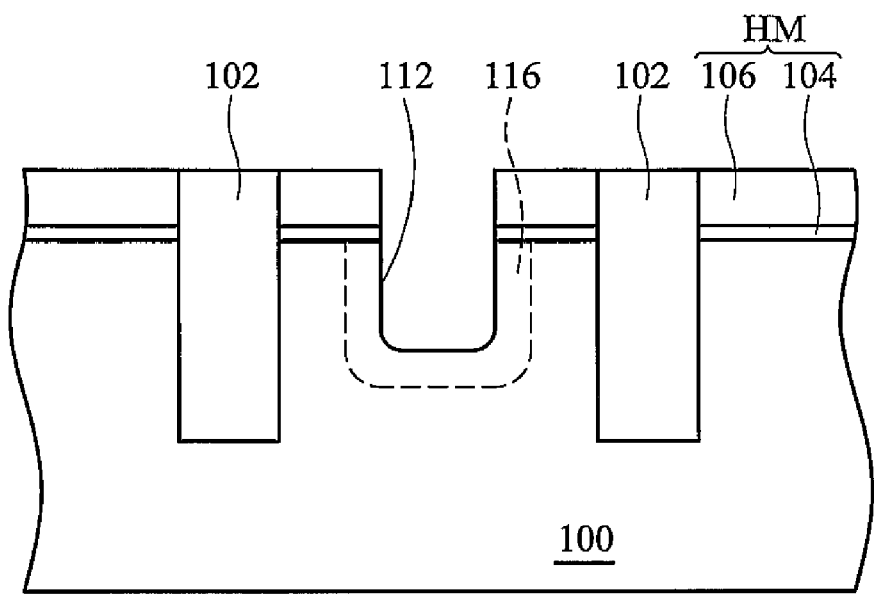

Referring now to FIG. 5 and FIG. 6, the impurities of the doped insulating layer 114 are out-diffused and driven into the semiconductor substrate 100 adjacent to the doped insulating layer 114 so as to form a doped region 116 by rapid thermal process (RTP) at 300 to 1000, preferably 300 to 500. The diffusion depth of the doped region 116 is about 100 Å to 600 Å, preferably about 100 Å to 500 Å, more preferably 300 Å. The formation of the doped region 116 in the semiconductor substrate 100 described above is so-called solid phase doping (SPD). Next, the doped insulating layer 114 is removed by dry etching using an etching gas containing hydrofluoric gas or wet etching using an etchant containing hydrofluoric acid until the doped region 116 is exposed.

Figure 4B:
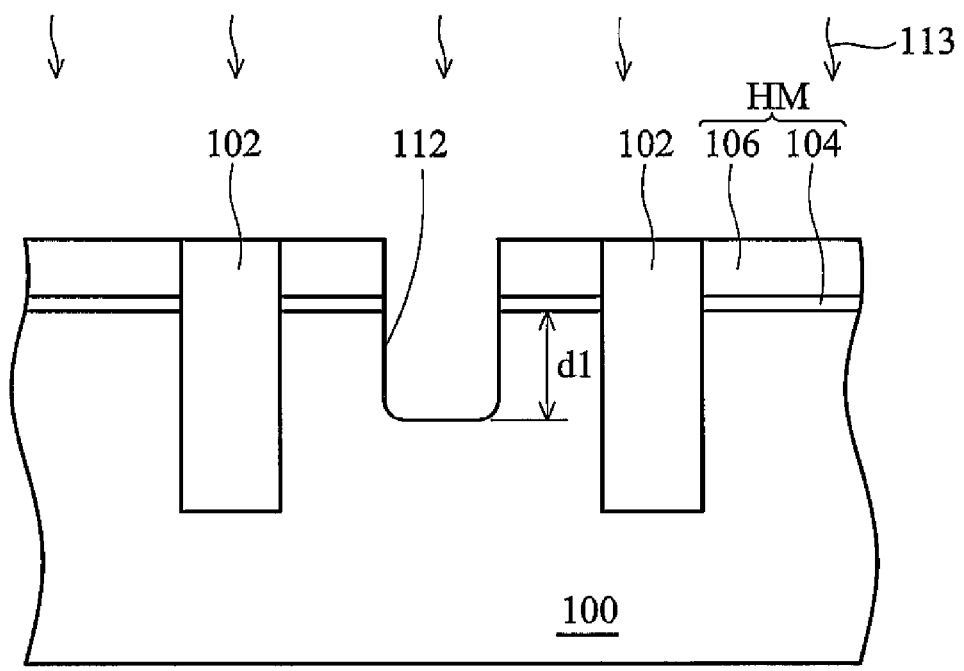

Referring to FIG. 4 and FIG. 6 illustrate another exemplary embodiment fabricating a semiconductor device. In this gas phase doping (GPD) is conducted and gaseous impurities 113 are introduced into the semiconductor substrate 100 to form a doped region 116 as shown in FIG. 6. Gas phase doping can be replaced with liquid phase doping (LPD) to introduce liquid impurities into the semiconductor substrate 100.

Figure 7:
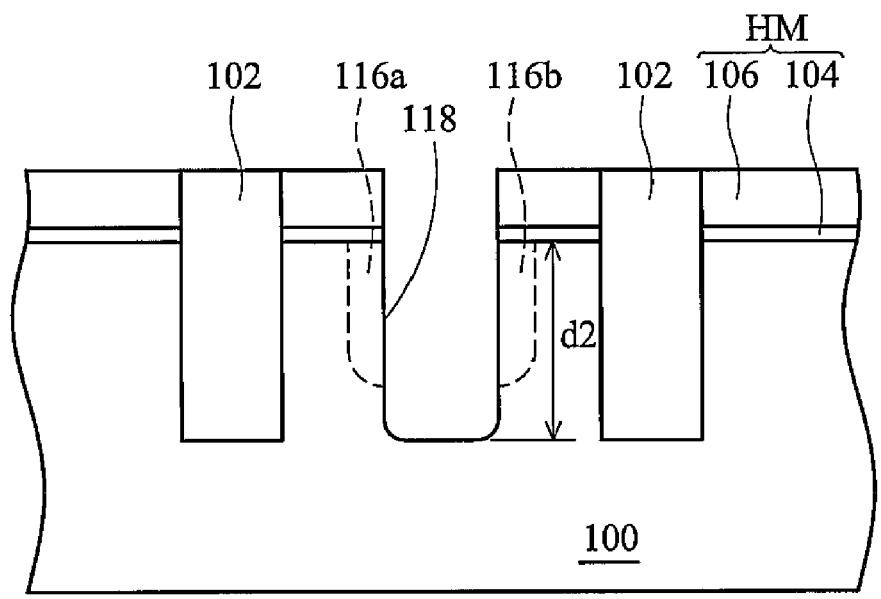

As shown in FIG. 7, the doped region 116 and the semiconductor substrate 100 underlying the first trench 112 are anisotropically etched to form a second trench 118 having a second depth d2 while the trench etch mask HM is used as a shield. The etch depth in this step is less than 600 Å, preferably 300 Å to 600 Å, more preferably 300 Å to 500 Å. That is to say, the first depth d1 and the second depth d2 have a depth difference of less than 600 Å, preferably 300 Å to 600 Å, more preferably 300 Å to 500 Å. After this etching step, doped regions 116a, 116b, also referred to as lightly doped drains (LDD), remain on the sidewall of the second trench 118 and a recessed channel is created between the doped region 116a and the doped region 116b. Compared with the related art, the recessed channel length is mainly determined by the step of forming second trench 118 via etching doped region 116 and the semiconductor substrate 100. Thus, the channel lengths of metal oxide semiconductor (MOS) transistors are easily controlled. The channel lengths of MOS transistors in the center and the edge become more uniform. According to some embodiments of the invention, the uniformity problem may be solved; the channel length may be easily controlled and adjusted.

The channel length is mainly determined by the formation of the second trench 118 which is etched with reactive ion etching (RIE) using an etching gas containing $Cl_2$, HBr, $O_2$, $CF_4$ or $SF_6$. Because the etch depth of the second trench 118 is less than 600 Å, etching conditions and etching duration are easily controlled without large variation.

Figure 8:
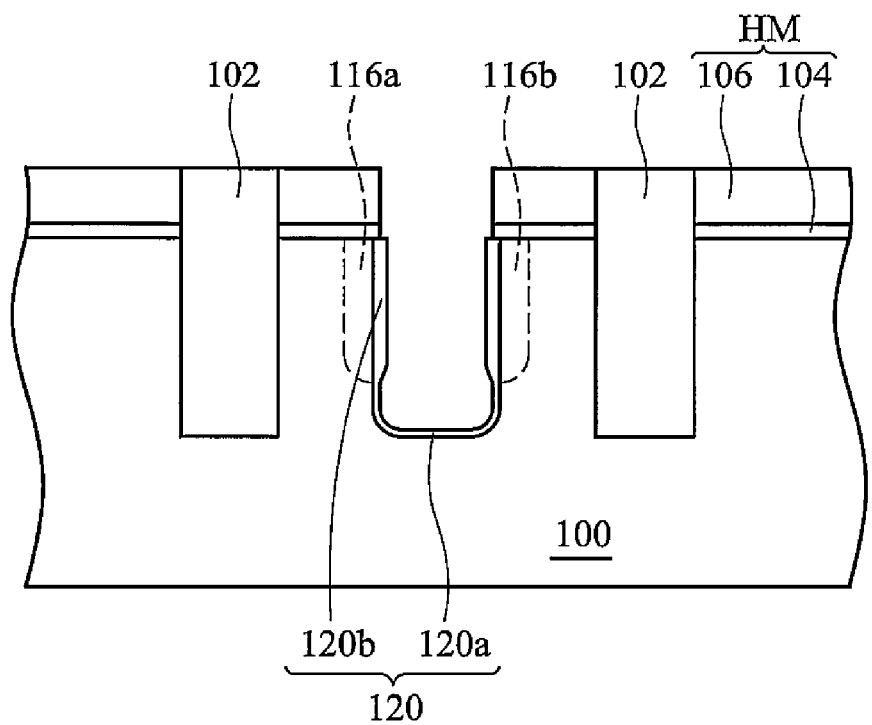

Then, as shown in FIG. 8, a gate insulating layer 120 consisting of gate insulating layer 120a and gate insulating layer 120b is formed on the sidewall and the bottom of the second trench 118 by thermal oxidation at a temperature of about 800 Å to 1100 Å. The gate insulating layer 120b on the sidewall of the second trench 118 is thicker than the gate insulating layer 120a at the bottom the second trench 118 because the oxidation rate of the doped regions 116a and 116b is higher than that of the semiconductor substrate 100 at the bottom of the second trench 118. The thicknesses of the gate insulating layer 120b and the gate insulating layer 120a are for example 50 Å to 150 Å and 20 Å to 60 Å respectively.

Because gate insulating layer 120b is relatively thicker than the gate insulating layer 120a, capacitance between the gate and drain (Cgd) can be reduced and gate-induced drain leakage can be reduced. The oxide gate insulating layer formed by thermal oxidation can also be replaced with an insulating layer of silicon oxide, silicon nitride, silicon oxynitride, or titanium oxide formed by chemical vapor deposition (CVD). The deposited gate insulating layer has a relatively uniform thickness.

Figure 9:
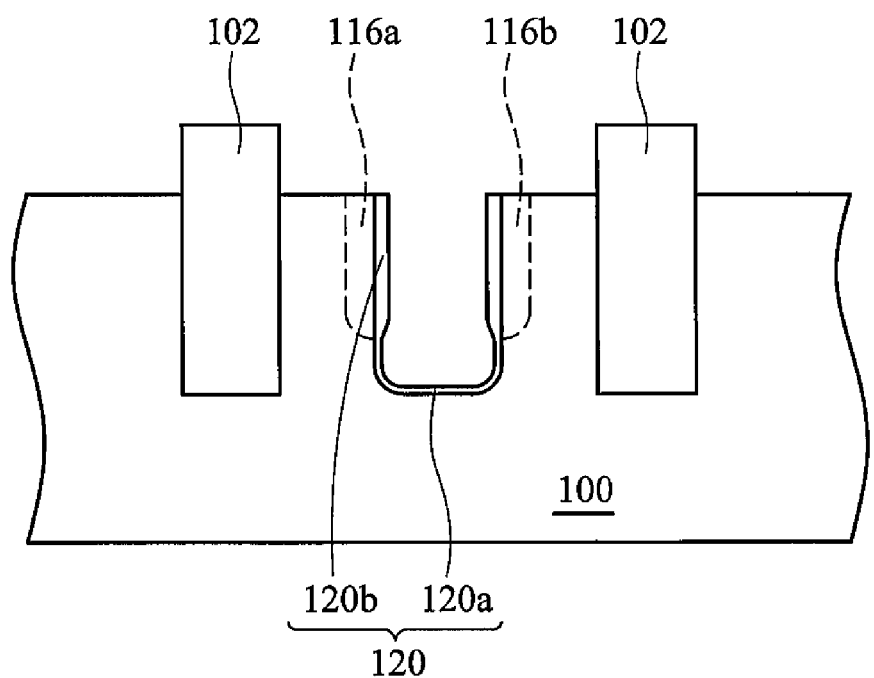

Next, referring to FIG. 9, the trench etch mask HM is removed by wet etching using an etchant containing hot phosphoric acid or hydrofluoric acid or dry etching. A portion of the shallow trench isolation 102 may be removed in this etch step from the upper surface thereof.

Figure 10:
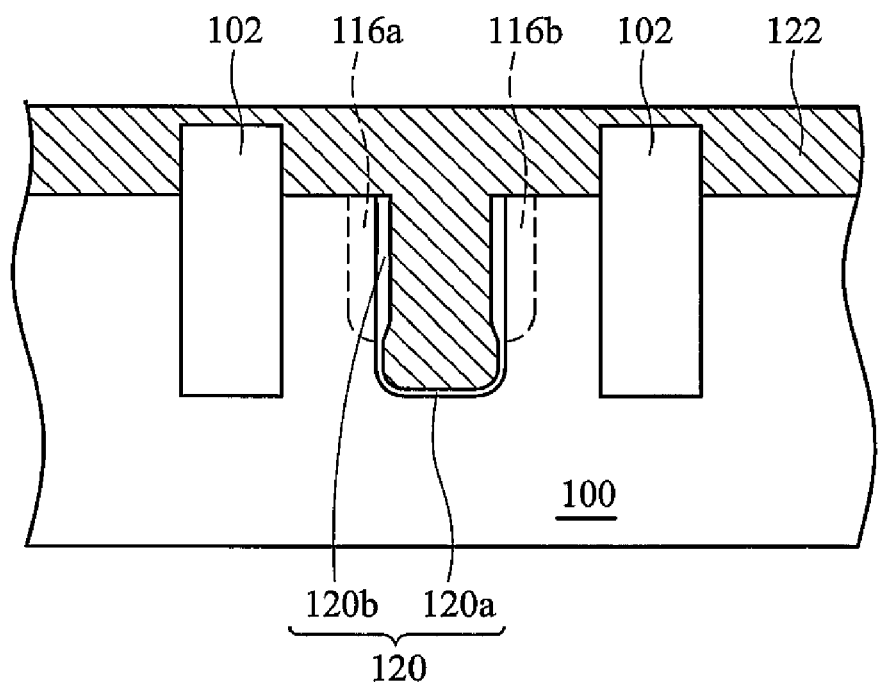

As shown in FIG. 10, a conductive layer 122 such as a doped polysilicon layer is then blanket deposited by plasma enhanced chemical vapor deposition (PECVD), low pressure chemical vapor deposition (LPCVD), or high density plasma chemical vapor deposition (HDPCVD) filling into the second trench 118. Alternately, a conductive layer comprising aluminum, copper, tungsten, or an alloy thereof can be used to replace the polysilicon layer.

Figure 11:
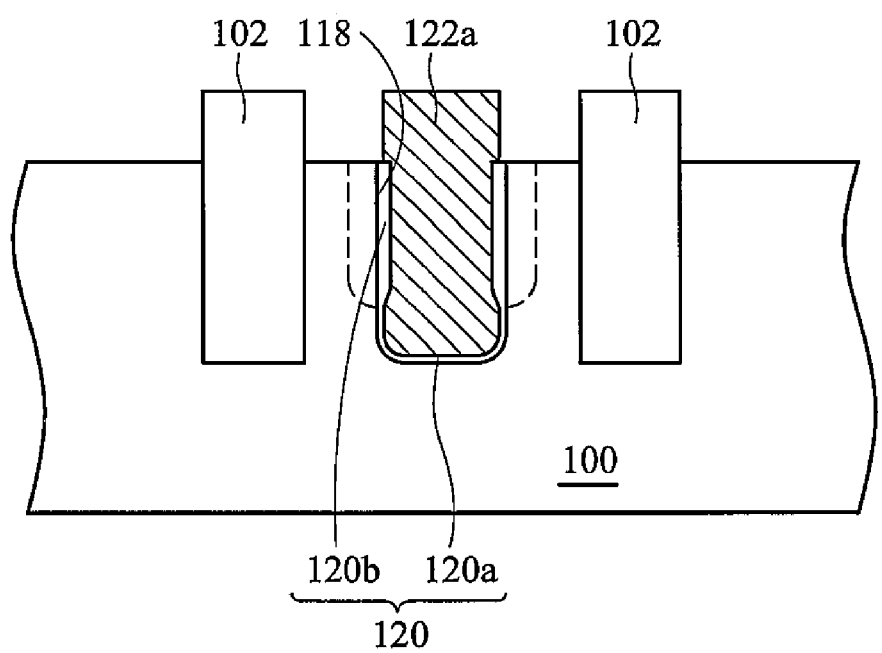

As shown in FIG. 11, the conductive layer 122 is then defined to form a trench gate 122a in the second trench 118. For example, a photoresist pattern (not shown) is formed on the conductive layer 122 using photolithography followed by selective etching of the conductive layer 122 using the photoresist pattern as an etch mask to form the trench gate 122a.

Figure 12:
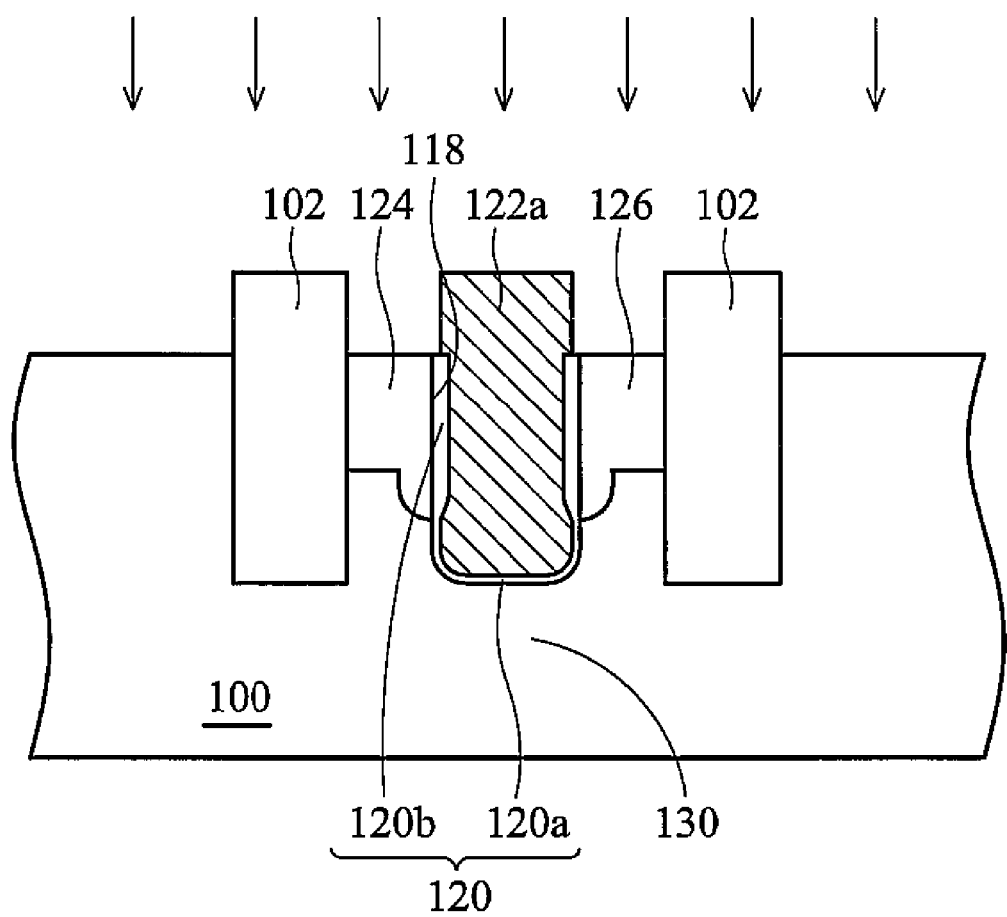

Next, referring to FIG. 12, after forming the trench gate 122a, n-type ions such as P or As or p-type ions such as B are optionally doped into the lightly doped regions 116a, 116b and the semiconductor substrate 100 between the doped regions 116a, 116b and shallow trench isolation 102 in a self-aligned manner to form self-aligned source/drain regions 124 and 126. At the same time, a recessed channel 130. That is to say, there is no need to use an ion doping mask consisting of photoresist material by photolithography to form the self-aligned source/drain regions 124, 126, thus the step is called self-aligned ion doping.

In some embodiments of the invention, after forming the trench gate 122a, impurities of the doped regions 116a, 116b are thermally diffused to be self-aligned source/drain region 124, 126. In this step, the length of recessed channel 130 may be slightly changed. However, the channel length metal oxide semiconductor (MOS) transistor is still easily controlled.

As shown in FIG. 12, in some embodiments of metal oxide semiconductor (MOS), the semiconductor device, having a trench gate may comprise a semiconductor substrate 100 having second trench 118 and an insulating layer 120 such as a thermal oxide on the sidewall and the bottom of the second trench 118. The gate insulating layer 120b on the sidewall of the second trench 118 is thicker than the gate insulating layer 120a at the bottom of the second trench 118. The semiconductor device further comprises source/drain regions 124 and 126 formed in the semiconductor substrate 100 adjacent to the sidewall of the second trench 118, a recessed channel 130 in the semiconductor substrate 100 underlying the second trench 118 and a trench gate 122a formed in the second trench 118.

FIGS. 13 to 16 are cross sections of another exemplary process flow of manufacturing a semiconductor device having a trench gate.

Figure 13:
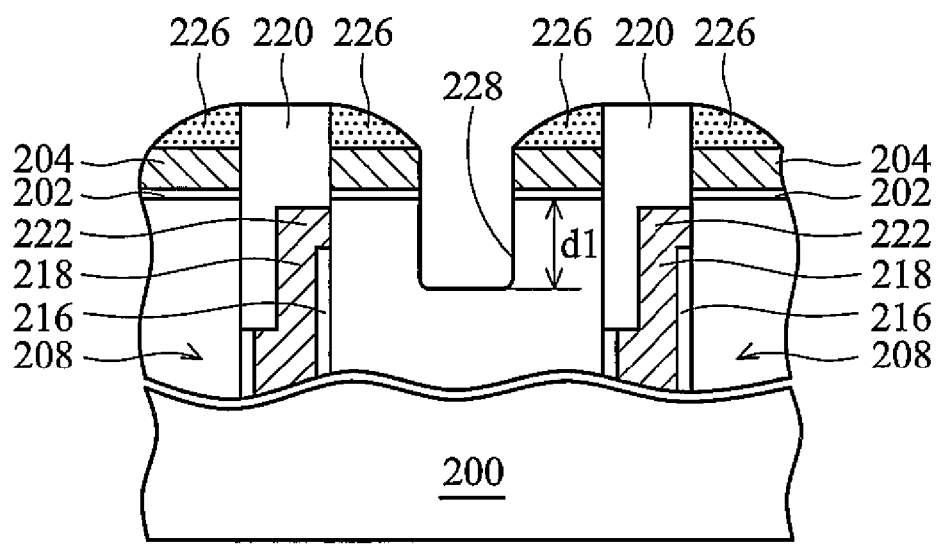
FIGS. 13 to 16 are cross sections of another exemplary process flow of manufacturing a semiconductor device having a trench gate.

As shown in FIG. 13, a semiconductor substrate 200 having a trench capacitor portion 208 including an upper electrode/a dielectric layer/a bottom electrode (not shown) is provided. The trench capacitor portion 208 further comprises a collar oxide 216, a buried strap 222 and a conductive layer 218. A pad oxide 202 and a silicon nitride layer 204 are formed on the semiconductor substrate 200. A spacer 226 comprising silicon nitride, silicon oxynitride or oxide is formed on the silicon nitride layer 204. The spacer 226 is formed by depositing a spacer material layer on a protruding single-side insulating layer 220 and the silicon nitride layer 204 followed by etching back the spacer material layer to form the self-aligned spacer 226, capable of defining the position of the trench gate, on the silicon nitride layer 204 and sidewall of the protruding single-side insulating layer 220.

Next, the semiconductor substrate 200 is etched to form a first trench 228 having a first depth d1 of about 1000 Å to 3000 Å, preferably 2000 Å while the spacer 226, silicon nitride layer 204 and the single-side insulating layer 220 are used as trench etch masks. The semiconductor substrate 200 is preferably etched by reactive ion etching (RIE) using an etching gas containing $Cl_2$, HBr, $O_2$, $CF_4$ or $SF_6$.

Figure 14:
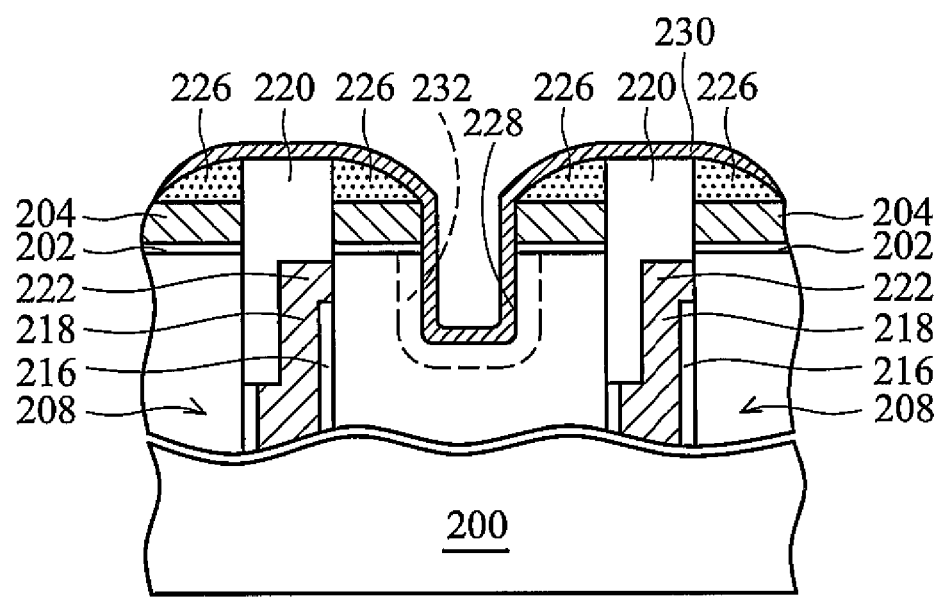

Then, as shown in FIG. 14, a doped insulating layer 230 having a thickness of about 50 Å to 300 Å is conformally formed on the sidewall and the bottom of the first trench 228 in order to form a doped region as a self-aligned source/drain region. The doped insulating layer 230 contains n-type or p-type impurities (dopants). The doped insulating layer 230 is for example phosphosilicate glass (PSG), arsenic silicate glass (ASG) or borosilicate glass (BSG). Moreover, the doped insulating layer 230 may be formed by plasma enhanced chemical vapor deposition (PECVD), low pressure chemical vapor deposition (LPCVD) or atomic layer chemical vapor deposition (ALCVD). The impurities of the doped insulating layer 230 is out-diffused and driven into the semiconductor substrate 200 adjacent to the doped insulating layer 230 to form a doped region 232 by rapid thermal process (RTP) at 700 to 1100. The diffusion depth the doped region 116 is about 100 Å to 600 Å, preferably about 100 Å to 500 Å, more preferably 300 Å. The formation of the doped region 116 in the semiconductor substrate 100 described above is so-called solid phase doping (SPD).

Figure 15:
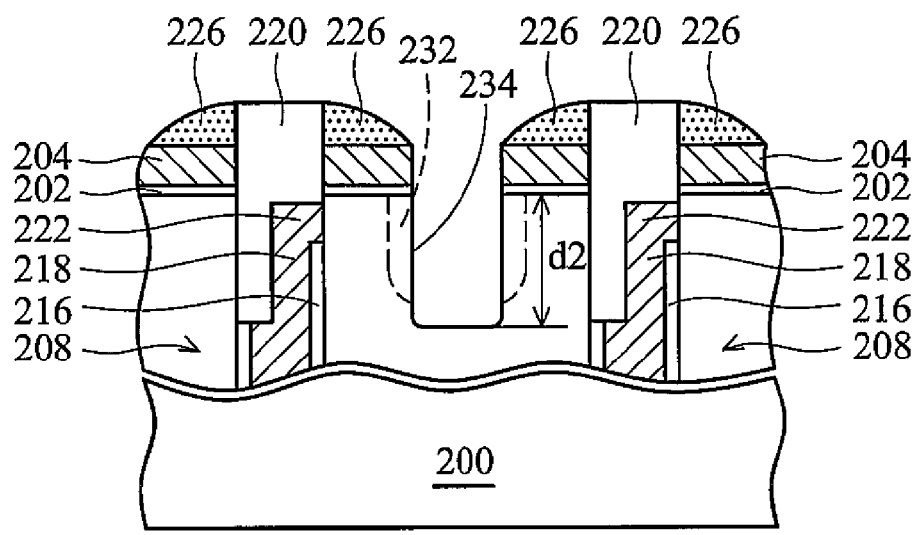
Figure 16:
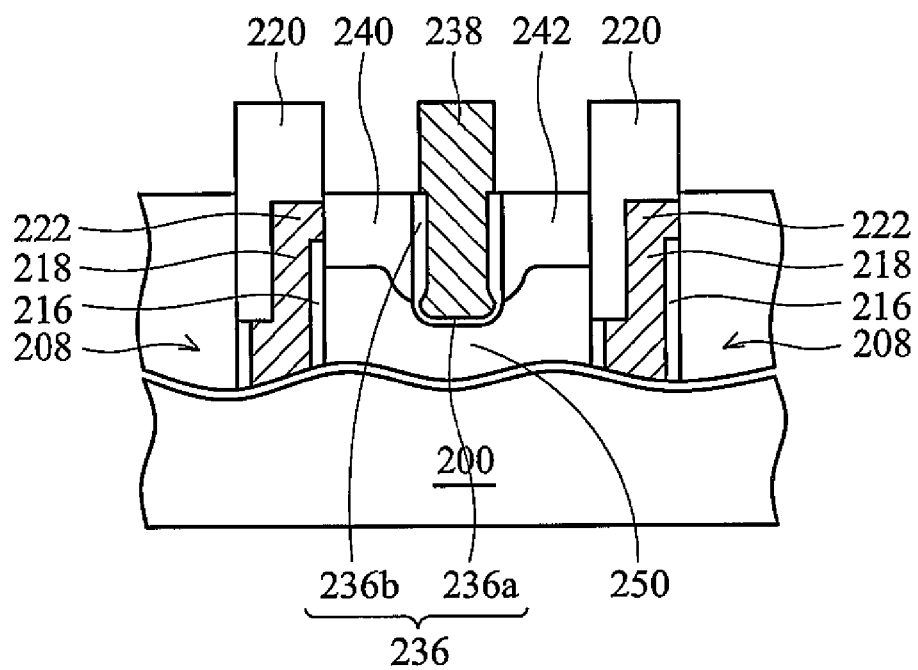

Next, the doped insulating layer 230 is removed by dry etching using an etching gas containing hydrofluoric gas or wet etching using an etchant containing hydrofluoric acid until the doped region 232 is exposed as shown in FIG. 15. The doped region 232 and the semiconductor substrate 200 underlying the first trench 228 are anisotropically etched through the first trench 228 to form a second trench 234 having a second depth d2 while the spacer 226, the silicon nitride layer 204, and the pad oxide layer 202 are used as etch masks. The etch depth in this step is less than 600 Å, preferably 300 Å to 600 Å, more preferably 300 Å to 500 Å. That is to say, the first depth d1 and the second depth d2 have a depth difference less than 600 Å, preferably 300 Å to 600 Å, more preferably 300 Å to 500 Å.

A gate insulating layer 236 consisting of gate insulating layer 236a and gate insulating layer 236b is formed on the sidewall and the bottom of the second trench 234 by thermal oxidation at a temperature of about 800 to 1100. The gate insulating layer 236b on the sidewall of the second trench 234 is thicker than the gate insulating layer 236a at the bottom the second trench 234 because the oxidation rate of the doped regions 236a and 236b is higher than that of the semiconductor substrate 200 at the bottom of the second trench 234. The spacer 226, the silicon nitride layer 204 and the pad oxide layer 202 are then etched by wet etching or dry etching to expose the upper surface of the semiconductor substrate 200.

A conductive layer such as a doped polysilicon layer is then blanket deposited by plasma enhanced chemical vapor deposition (PECVD), low pressure chemical vapor deposition (LPCVD), or high density plasma chemical vapor deposition (HDPCVD) filling into the second trench 234. Alternately, a conductive layer can comprise aluminum, copper, tungsten, or an alloy thereof.

The conductive layer is then defined to form a trench gate 238 in the second trench 234. For example, a photoresist pattern (not shown) is formed on the conductive layer using photolithography followed by selectively etching the conductive layer using the photoresist pattern as an etch mask to form the trench gate 238.

After forming the trench gate 238, n-type ions such as P or As or p-type ions such as B are optionally doped into the lightly doped region 232 and the semiconductor substrate 200 between the doped region 232 and trench capacitor portion 208 in a self-aligned manner to form self-aligned source/drain regions 240 and 242 and a recessed channel 250 is created between the source/drain regions 240 and 242.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device having a trench gate, comprising:
   a semiconductor substrate;
   a trench disposed in the semiconductor substrate;
   a gate insulating layer formed on a sidewall and a bottom of the trench;
   a source/drain formed in the semiconductor substrate adjacent to the sidewall of the trench;
   a lightly doped drain region adjacent to the sidewall of the trench and below the source/drain region;
   a recessed channel in the semiconductor substrate underlying the trench; and
   a gate formed in the trench, wherein the gate insulating layer comprises a first portion and a second portion, and the first portion is thicker than the second portion, the first portion is positioned on the sidewall of the trench adjacent to the source/drain region and the lightly doped drain region, and the second portion is positioned at the bottom and the remaining part of the sidewall of the trench.

2. The semiconductor device having a trench gate as claimed in claim 1, further comprising a trench capacitor formed in the semiconductor substrate.

3. The semiconductor device having a trench gate as claimed in claim 1, wherein the source/drain is a self-aligned source/drain.

4. The semiconductor device having a trench gate as claimed in claim 1, wherein the gate insulating layer is thermal oxide layer.

* * * * *